(12) United States Patent
Horng et al.

(10) Patent No.: US 8,790,963 B2
(45) Date of Patent: Jul. 29, 2014

(54) LED ARRAY FORMED BY INTERCONNECTED AND SURROUNDED LED CHIPS

(75) Inventors: Ray-Hua Horng, Taichung (TW); Heng Liu, Sunnyvale, CA (US); Yi-An Lu, Chiayi (TW)

(73) Assignees: Phostek, Inc., Hsinchu (TW); NCKU Research and Development Foundation, Tainan (TW)

( * ) Notice: Subject to any disclaimer, the term of this patent is extended or adjusted under 35 U.S.C. 154(b) by 176 days.

(21) Appl. No.: 13/287,590

(22) Filed: Nov. 2, 2011

(65) Prior Publication Data
US 2012/0193653 A1  Aug. 2, 2012

(30) Foreign Application Priority Data
Feb. 1, 2011  (TW) .............................. 100104004 A

(51) Int. Cl.
| | | |
|---|---|---|
| H01L 21/00 | (2006.01) | |
| H01L 25/075 | (2006.01) | |
| H01L 23/00 | (2006.01) | |
| H01L 33/54 | (2010.01) | |
| H01L 33/62 | (2010.01) | |
| H01L 33/64 | (2010.01) | |

(52) U.S. Cl.
CPC ............. *H01L 25/0753* (2013.01); *H01L 33/54* (2013.01); *H01L 33/62* (2013.01); *H01L 33/641* (2013.01); *H01L 24/24* (2013.01); *H01L 2224/73267* (2013.01); *H01L 2224/24137* (2013.01); *H01L 2933/0066* (2013.01)
USPC ...................... 438/108; 257/93; 257/E33.062

(58) Field of Classification Search
USPC .............................. 257/93, E33.062; 438/108
See application file for complete search history.

(56) References Cited

U.S. PATENT DOCUMENTS

| | | | |
|---|---|---|---|
| 6,547,249 | B2 | 4/2003 | Collins, III et al. |
| 7,535,028 | B2 * | 5/2009 | Fan et al. ......................... 257/88 |
| 2006/0169993 | A1 | 8/2006 | Fan et al. |
| 2009/0127575 | A1 | 5/2009 | Horng et al. |
| 2010/0136728 | A1 | 6/2010 | Horng et al. |
| 2010/0252103 | A1 * | 10/2010 | Yao et al. ...................... 136/256 |

\* cited by examiner

*Primary Examiner* — Amar Movva
(74) *Attorney, Agent, or Firm* — Huffman Law Group, PC

(57) ABSTRACT

A light emitting diode array includes a first light emitting diode having a first electrode and a second light emitting diode having a second electrode. The first and second light emitting diodes are separated. A first polymer layer is positioned between the light emitting diodes. An interconnect located at least partially on the first polymer layer connects the first electrode to the second electrode. A permanent substrate is coupled to the light emitting diodes. The permanent substrate is coupled to the side of the light emitting diodes opposite the interconnect. A second polymer layer at least partially encapsulates the side of the light emitting diodes with the interconnect.

20 Claims, 12 Drawing Sheets

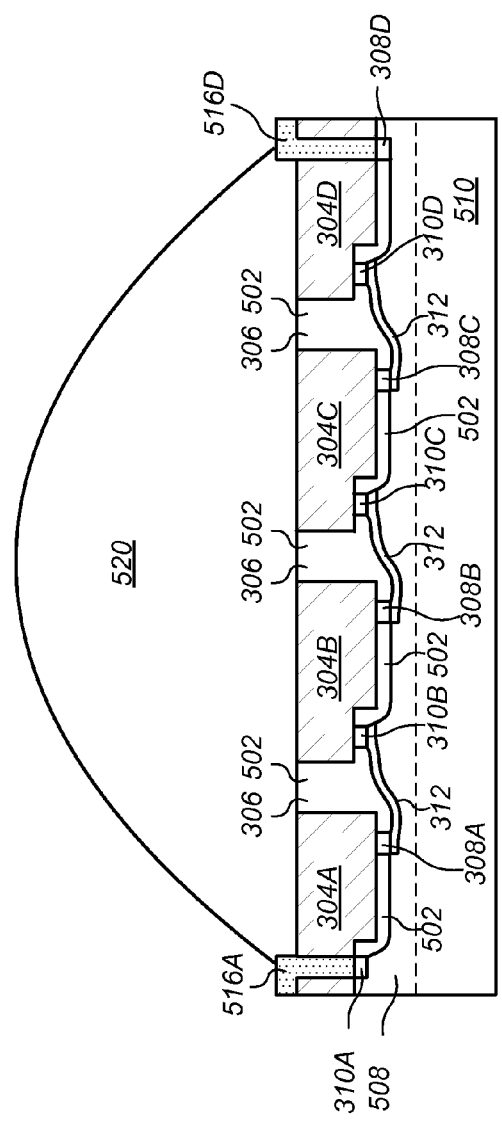
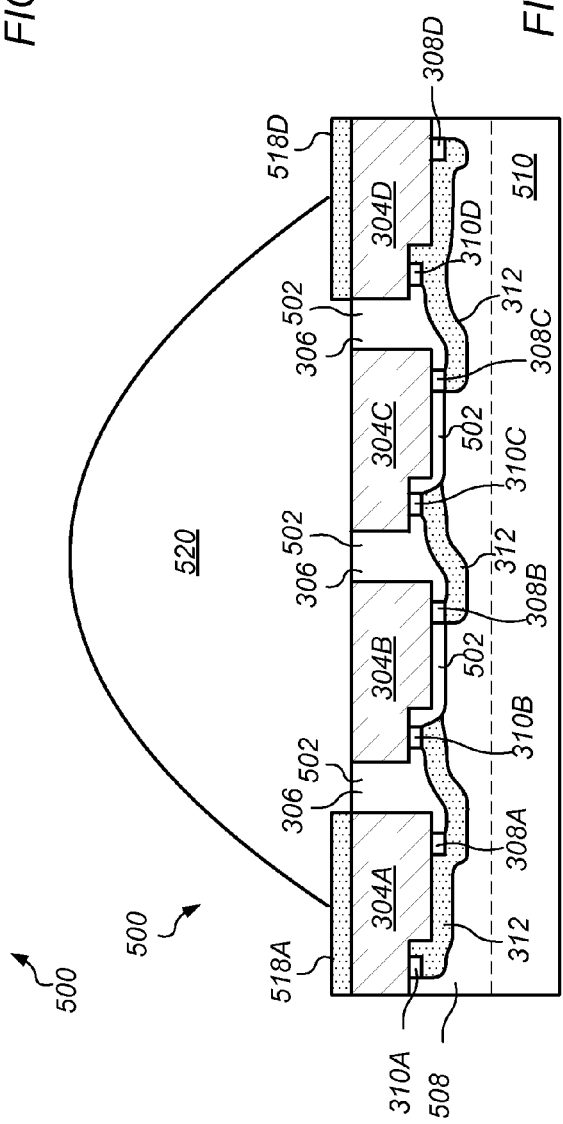

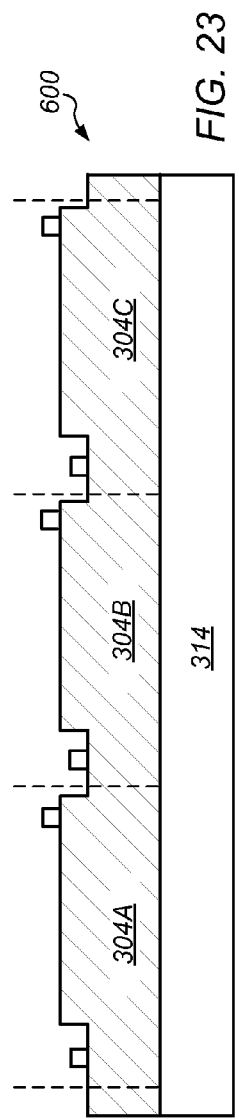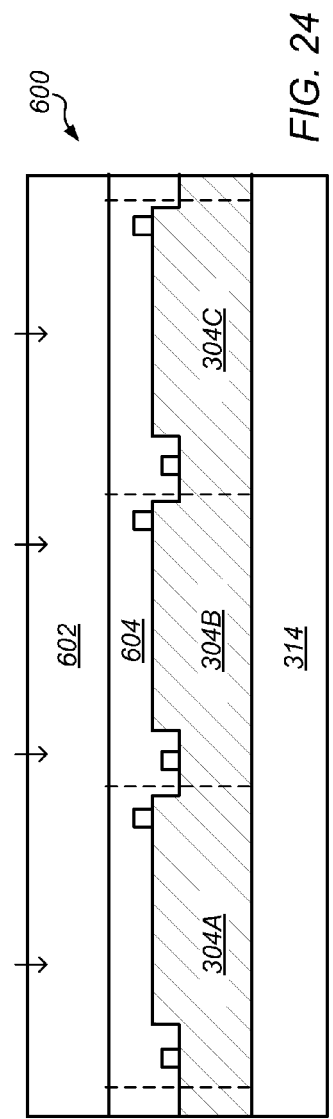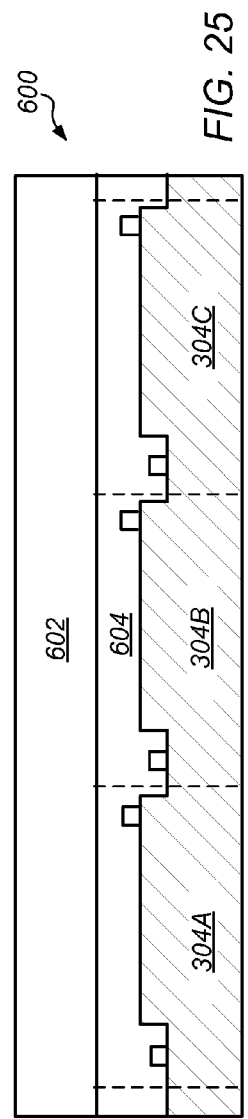

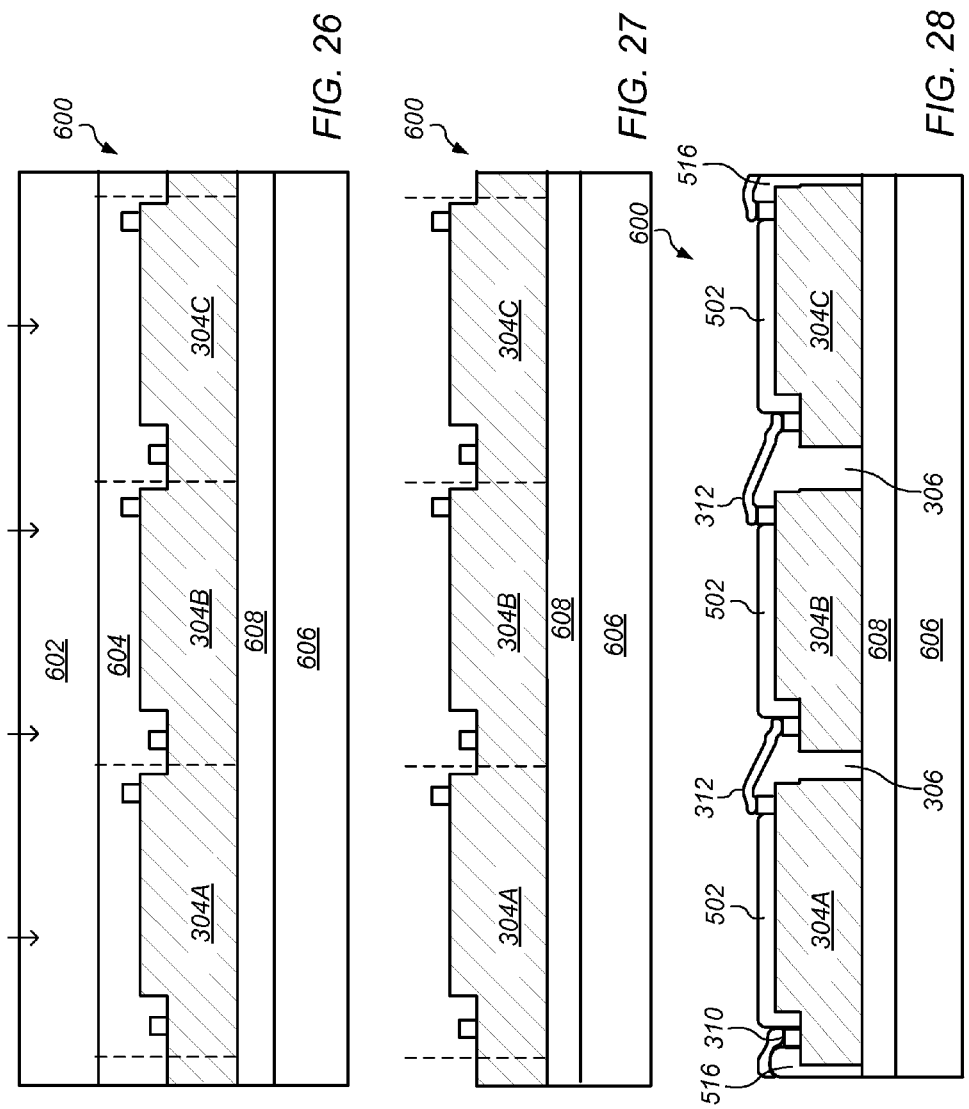

LED ARRAY FORMED BY INTERCONNECTED AND SURROUNDED LED CHIPS

BACKGROUND

1. Field of the Invention

The present invention relates to a semiconductor light emitting component, and more particularly to a light emitting diode (LED) array and a method for manufacturing the LED array.

2. Description of Related Art

FIG. 1 illustrates a schematic view of a conventional horizontal light emitting diode. Referring to FIG. 1, horizontal light emitting diode 100 includes epitaxial substrate 102. Epitaxial structure 104 is grown from the epitaxial substrate by an epitaxial growth process. Electrode unit 106 is formed on the epitaxial structure for providing electrical energy. Epitaxial substrate 102 is made of a material such as sapphire or SiC so that epitaxial growth of group-III nitride (e.g., gallium-nitride-based (GaN-based) or indium-gallium-nitride-based (InGaN-based) semiconductor material) can be achieved on epitaxial substrate 102.

Epitaxial structure 104 is usually made of GaN-based semiconductor material or InGaN-based semiconductor material. During the epitaxy growth process, GaN-based semiconductor material or InGaN-based semiconductor material epitaxially grows up from epitaxial substrate 102 to form n-type doped layer 108 and p-type doped layer 110. When the electrical energy is applied to epitaxial structure 104, light emitting portion 112 at junction of n-type doped layer 108 and p-type doped layer 110 generates an electron-hole capture phenomenon. As a result, the electrons of light emitting portion 112 will fall to a lower energy level and release energy with a photon mode. For example, light emitting portion 112 is a multiple quantum well (MQW) structure capable of restricting a spatial movement of the electrons and the holes. Thus, a collision probability of the electrons and the holes is increased so that the electron-hole capture phenomenon occurs easily, thereby enhancing light emitting efficiency.

Electrode unit 106 includes first electrode 114 and second electrode 116. First electrode 114 and second electrode 116 are in ohmic contact with n-type doped layer 108 and p-type doped layer 110, respectively. The electrodes are configured to provide electrical energy to epitaxial structure 104. When a voltage is applied between first electrode 114 and second electrode 116, an electric current flows from the second electrode to the first electrode through epitaxial structure 104 and is horizontally distributed in epitaxial structure 104. Thus, a number of photons are generated by a photoelectric effect in epitaxial structure 104. Horizontal light emitting diode 100 emits light from epitaxial structure 104 due to the horizontally distributed electric current.

A manufacturing process of horizontal light emitting diode 100 is simple. However, horizontal light emitting diodes can cause several problems such as, but not limited to, current crowding problems, non-uniformity light emitting problems, and thermal accumulation problems. These problems may decrease the light emitting efficiency of the horizontal light emitting diode and/or damage the horizontal light emitting diode.

To overcome some of the above mentioned problems, vertical light emitting diodes have been developed. FIG. 2 depicts a schematic view of a conventional vertical light emitting diode. Vertical light emitting diode 200 includes epitaxial structure 204 and electrode unit 206 disposed on the epitaxial structure for providing electrical energy. Similar to horizontal light emitting diode 100 shown in FIG. 1, epitaxial structure 204 can be made of GaN-based semiconductor material or InGaN-based semiconductor material by an epitaxial growth process. During the epitaxial growth process, the GaN-based semiconductor material and the InGaN-based semiconductor material epitaxially grows up from an epitaxial substrate (not shown) to form n-type doped layer 208, light emitting structure 212, and p-type doped layer 210. Then, electrode unit 206 is bonded to epitaxial structure 204 after stripping the epitaxial substrate. Electrode unit 206 includes first electrode 214 and second electrode 216. First electrode 214 and second electrode 216 are in ohmic contact with n-type doped layer 208 and p-type doped layer 210, respectively. In addition, second electrode 216 can adhere to heat dissipating substrate 202 so as to increase the heat dissipation efficiency. When a voltage is applied between first electrode 214 and second electrode 216, an electric current vertically flows. Thus, conventional vertical light emitting diode 200 can effectively improve the current crowding problem, the non-uniformity light emitting problem and the thermal accumulation problem of horizontal light emitting diode 100. However, a shading effect of the electrodes is a problem in the conventional vertical light emitting diode depicted in FIG. 2. In addition, the manufacturing process for forming vertical light emitting diode 200 may be complicated. For example, epitaxial structure 204 may be damaged by high heat when adhering second electrode 216 to heat dissipating substrate 202.

In recent years, wide-bandgap nitride-based LEDs with wavelength range from the ultraviolet to the shorter wavelength parts of the visible spectra have been developed. LED devices can be applied to new display technologies such as traffic signals, liquid crystal display TVs, and backlights of cell phones. Due to the lack of native substrates, GaN films and related nitride compounds are commonly grown on sapphire wafers. Conventional LEDs (such as those described above) are inefficient because the photons are emitted in all directions. A large fraction of light emitted is limited in the sapphire substrate and cannot contribute to usable light output. Moreover, the poor thermal conductivity of the sapphire substrate is also a problem associated with conventional nitride LEDs. Therefore, freestanding GaN optoelectronics without the use of sapphire is a desirable technology that solves this problem. The epilayer transferring technique is a well-known innovation in achieving ultrabright LEDs. Thin-film p-side-up GaN LEDs with highly reflective reflector on silicon substrate made by a laser lift-off (LLO) technique, combined with n-GaN surface roughening, have been established as an effective tool for nitride-based heteroepitaxial structures to eliminate the sapphire constraint. The structure is regarded as a good candidate for enhancing the light extraction efficiency of GaN-based LEDs. However, this technique is also subject to the electrode-shading problem. The emitted light is covered and absorbed by the electrodes, which results in reduced light efficiency.

Thin-film n-side-up devices GaN LEDs with interdigitated imbedded electrodes may improve light emission by reducing some of the electrode-shading problem. While thin-film n-side-up devices GaN LEDs provide enhanced properties compared to thin-film p-side-up devices GaN LEDs, there is still a need for improved structures and processes for making both p-side-up and n-side-up devices.

Furthermore, horizontal light emitting diode 100 and vertical light emitting diode 200 typically are packaged in single-die manners, which does not facilitate manufacturing a large area light source. In view of the problems discussed above with reference to FIG. 1 and FIG. 2, there is a need for a light emitting diode and a manufacturing method that overcomes the above disadvantages of the horizontal light emitting diodes and the vertical light emitting diodes and facilitates manufacturing a large area light source.

SUMMARY

In certain embodiments, a light emitting diode array includes a first light emitting diode having a first electrode and a second light emitting diode having a second electrode. The second light emitting diode is separated from the first light emitting diode. A first polymer layer is positioned between the first light emitting diode and the second light emitting diode. The first polymer layer may partially cover at least a portion of the surface of the first light emitting diode and at least a portion of the surface of the second light emitting diode. An interconnect is located at least partially on the first polymer layer that connects the first electrode to the second electrode. A permanent substrate is coupled to a side of the light emitting diodes opposite the interconnect. A second polymer layer at least partially encapsulates a side of the light emitting diodes with the interconnect.

In certain embodiments, a method for forming a light emitting diode array includes forming a first light emitting diode and a second light emitting diode separated on a first temporary substrate. A second temporary substrate is coupled to an upper surface of the light emitting diodes. The first temporary substrate is removed from the light emitting diodes. A permanent substrate is coupled to a side of the light emitting diodes from which the first temporary substrate has been removed. The second temporary substrate is removed from the light emitting diodes. A first polymer layer is formed between the first light emitting diode and the second light emitting diode. The first polymer layer covers at least a portion of the surface of the first light emitting diode and at least a portion of the surface of the second light emitting diode. An interconnect is formed between a first electrode on the first light emitting diode and a second electrode on the second light emitting diode. The interconnect is formed at least partially on the first polymer layer. The side of the light emitting diodes with the interconnect is at least partially encapsulated in a second polymer layer.

In certain embodiments, a method for forming a first light emitting diode and a second light emitting diode on a first temporary substrate. A second temporary substrate is coupled to an upper surface of the light emitting diodes. The first temporary substrate is removed from the light emitting diodes. A permanent substrate is coupled to a side of the light emitting diodes from which the first temporary substrate has been removed. The second temporary substrate is removed from the light emitting diodes. The first light emitting diode and the second light emitting diode are separated on the permanent substrate. A first polymer layer is formed between the first light emitting diode and the second light emitting diode. The first polymer layer covers at least a portion of the surface of the first light emitting diode and at least a portion of the surface of the second light emitting diode. An interconnect is formed between a first electrode on the first light emitting diode and a second electrode on the second light emitting diode. The interconnect is formed at least partially on the first polymer layer. The side of the light emitting diodes with the interconnect is at least partially encapsulated in a second polymer layer.

BRIEF DESCRIPTION OF THE DRAWINGS

Features and advantages of the methods and apparatus of the present invention will be more fully appreciated by reference to the following detailed description of presently preferred but nonetheless illustrative embodiments in accordance with the present invention when taken in conjunction with the accompanying drawings in which:

FIG. 14 depicts a schematic, cross-sectional view of an embodiment of the LED array depicted in FIG. 12 encapsulated in a second polymer layer.

FIG. 15 depicts a schematic, cross-sectional view of an embodiment of the LED array depicted in FIG. 13 encapsulated in a second polymer layer.

FIG. 23 depicts an embodiment of non-separated multiple LEDs on a first substrate.

FIG. 24 depicts the embodiment of FIG. 23 bonded to a second substrate with a first adhesive layer.

FIG. 25 depicts the embodiment of FIG. 24 with the first substrate removed from the LEDs.

FIG. 26 depicts the embodiment of FIG. 25 with a third substrate bonded to the LEDs with a second adhesive layer.

FIG. 27 depicts the embodiment of FIG. 26 with the first adhesive layer and the second substrate removed from the LEDs.

FIG. 28 depicts an embodiment of LEDs formed by separating the epitaxial structures and the third substrate depicted in FIG. 27, filling gaps between the LEDs with polymer material and forming interconnects between the LEDs.

Figure 1:
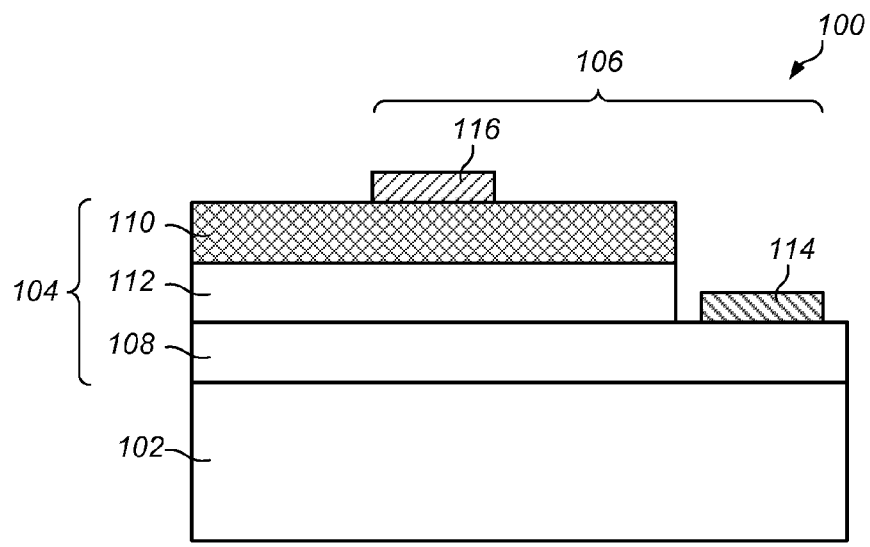
FIG. 1 illustrates a schematic view of a conventional horizontal light emitting diode.
Figure 2:
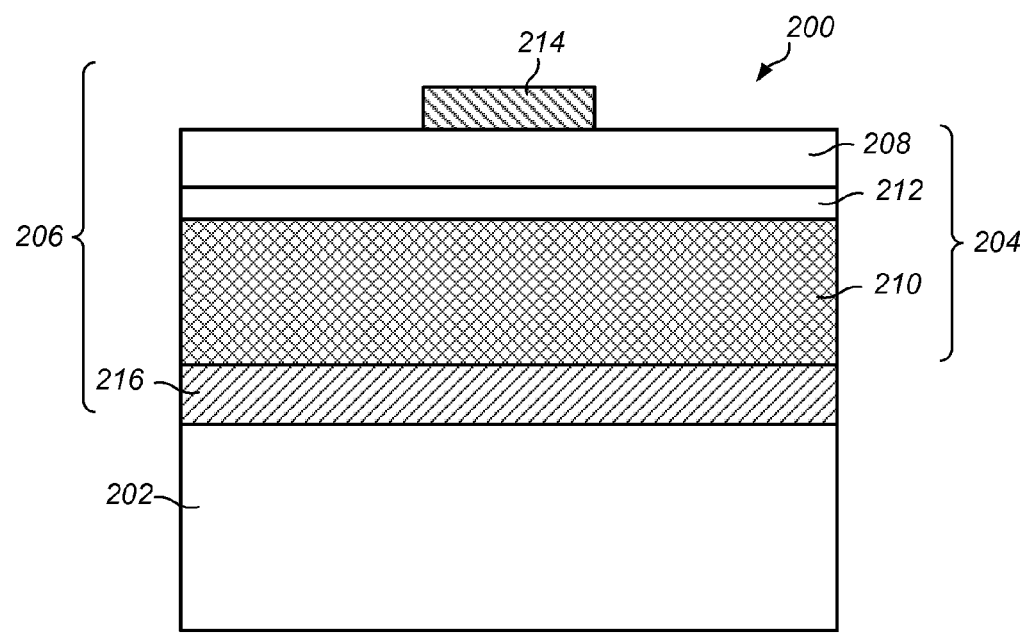
FIG. 2 illustrates a schematic view of a conventional vertical light emitting diode.

While the invention is susceptible to various modifications and alternative forms, specific embodiments thereof are shown by way of example in the drawings and will herein be described in detail. The drawings may not be to scale. It should be understood that the drawings and detailed description thereto are not intended to limit the invention to the particular form disclosed, but to the contrary, the intention is to cover all modifications, equivalents and alternatives falling within the spirit and scope of the present invention as defined by the appended claims.

DETAILED DESCRIPTION OF EMBODIMENTS

In the context of this patent, the term "coupled" means either a direct connection or an indirect connection (e.g., one or more intervening connections) between one or more objects or components.

Figure 3:
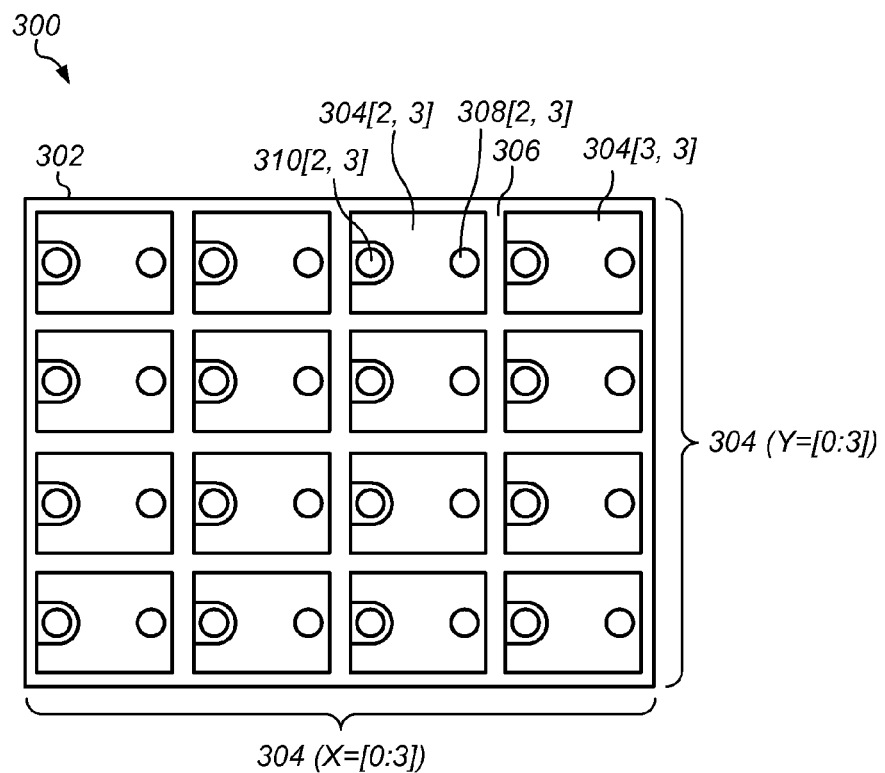
FIG. 3 depicts a schematic, top view of an embodiment of typical light emitting diode arrays formed on a temporary substrate.
Figure 4:
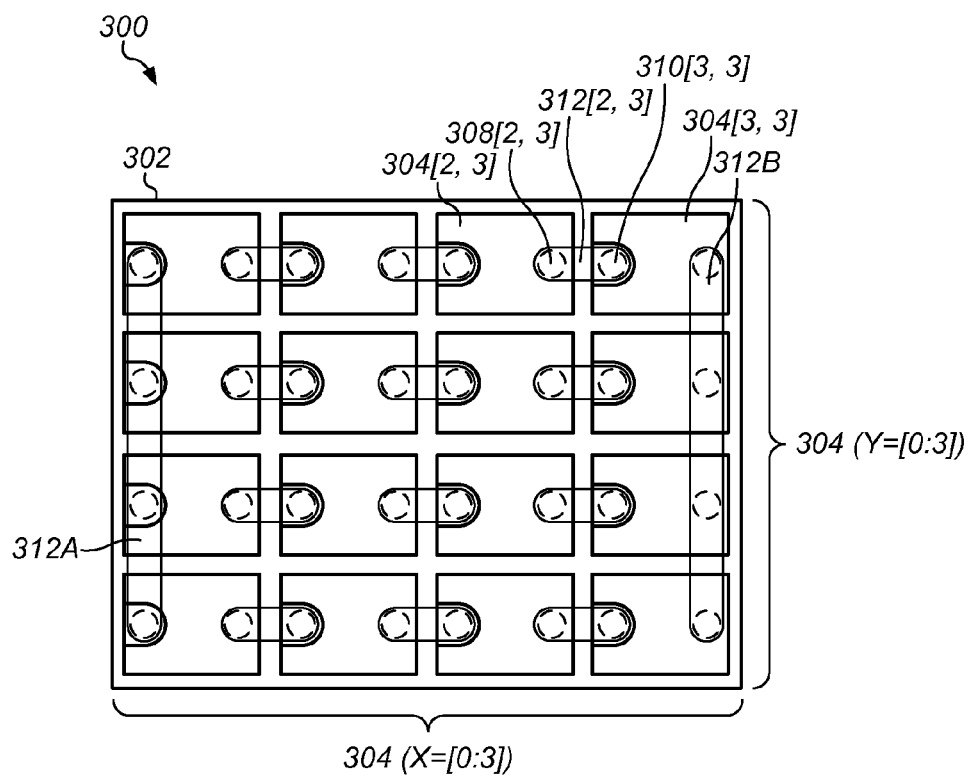
FIG. 4 depicts a schematic, top view of another embodiment of typical light emitting diode arrays formed on a temporary substrate.

FIGS. 3 and 4 depict schematic, top views of embodiments of typical light emitting diode arrays 300 formed on temporary substrate 302. Referring to FIG. 3, light emitting diode array 300 includes a number of light emitting diodes 304 arranged in rows and columns. In the depicted embodiment, light emitting diodes 304 are arranged in, but not limited to, four rows and in four columns. The numeral [X,Y] represents a position of light emitting diode 304 in X column and in Y row (X=0, 1, 2, 3; Y=0, 1, 2, 3). Thus, the numeral [0:3, 0:3] can represent light emitting diodes 304 in all positions of the light emitting diode array 300. Each of light emitting diodes 304 has a mesa-shaped configuration. Light emitting diodes 304 are spatially separated from each other by either a laser etching method, a dicing or cutting saw, or an inductively coupled plasma reactive ion etching (ICP-RIE) method. For example, gap 306 is formed between two adjacent light emitting diodes 304[2, 3] and 304[3, 3]. Light emitting diodes 304 typically have two electrodes. For example, the two electrodes of light emitting diodes 304[2, 3] include anode 308[2, 3] and cathode 310[2, 3], and can be respectively formed on a p-typed gallium-nitride (P-GaN) layer and an n-typed gallium-nitride (N-GaN) layer. In some embodiments, the P-GaN layer is located above the N-GaN layer or, in other embodiments, the N-GaN layer is located above the P-GaN layer. Light emitting diodes 304 can be electrically connected in parallel or in series, or they can be electrically connected in parallel and in series, to form light emitting diode array 300. In an embodiment, in one row, the anode of one of light emitting diodes 304 is proximate the cathode of an adjacent light emitting diode so that the light emitting diodes can be easily electrically connected in series. In addition, the anode and the cathode of light emitting diode 304 in a first row can be electrically connected, respectively, to the anode and the cathode of the light emitting diode in the row adjacent to the first row. Thus, light emitting diodes 304 in the two adjacent rows can be easily electrically connected in parallel. As a result, light emitting diodes 304 of light emitting diode array 300 can be electrically connected in parallel and in series.

Referring to FIG. 4, anode 308[0,Y] of light emitting diode 304[0, Y] is electrically connected to cathode 310[1, Y] of light emitting diode 304[1, Y] (Y=1, 2, 3) through a corresponding interconnect, anode 308[1, Y] of light emitting diode 304[1,Y] is electrically connected to cathode 310[2,Y] of light emitting diode 304[2, Y] (Y=1, 2, 3) through a corresponding interconnect, and anode 308[2, Y] of light emitting diode 304[2, Y] is electrically connected to cathode 310 [3, Y] of light emitting diode 304[3, Y] through interconnect 312[2, Y] (Y=1, 2, 3). For example, anode 308[2, 3] of light emitting diode 304[2, 3] is electrically connected to cathode 310[3, 3] of light emitting diode 210[3, 3] through series interconnect 312[2, 3]. Leftmost cathodes 310[0, 0], 310 [0, 1], 310 [0, 2], 310 [0, 3] of light emitting diodes 304[0, 0:3] are electrically connected to each other through a parallel interconnect 312A. Rightmost anodes 308[3, 0], 308 [3, 1], 308 [3, 2], 308 [3, 3] of light emitting diodes 304[3, 0:3] are electrically connected to each other through parallel interconnect 312B. Anode 308[0:3, 0:3] and cathode 310[0:3, 0:3] can be made of a metal-based material. Also, series interconnect 312, parallel interconnect 312A and the parallel interconnect 312B can be made of a metal-based material. It is noted that, the material of anode 308[0:3, 0:3] and cathode 310[0:3, 0:3] and the material of the series interconnect 312, parallel interconnect 312A, and parallel interconnect 312B can be either the same or different.

Figure 5:
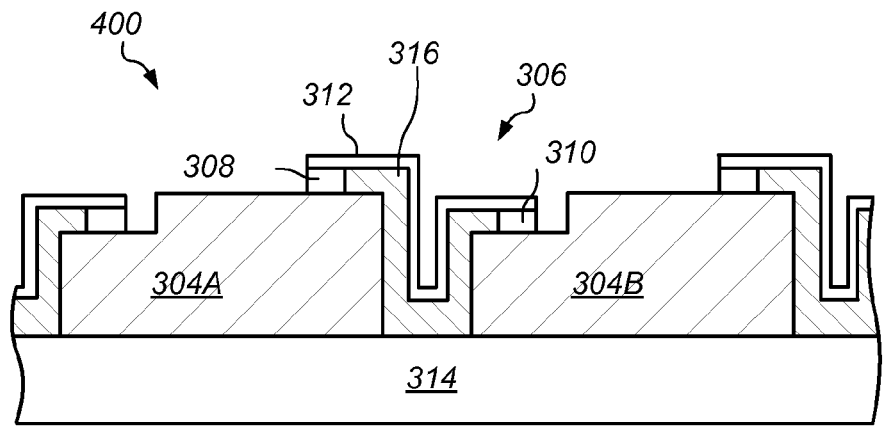
FIG. 5 depicts a schematic, partial, cross-sectional view of an embodiment of a conventional light emitting diode array.

FIG. 5 depicts a schematic, partial, cross-sectional view of an embodiment of conventional light emitting diode array 400. Similar to light emitting diode array 300 depicted in FIGS. 3 and 4, conventional light emitting diode array 400 includes a number of light emitting diodes arranged in an array. In FIG. 5, for simplicity, only two adjacent light emitting diodes including light emitting diode 304A and light emitting diode 304B are shown. Light emitting diodes 304A and 304B are disposed on first substrate 314. In certain embodiments, first substrate 314 is a temporary substrate. Light emitting diode 304A includes anode 308 and light emitting diode 304B includes cathode 310. Conventionally, oxide layer 316 is formed in gap 306 between light emitting diode 304A and light emitting diode 304B so that anode 308 and cathode 310 are insulated from other adjacent structures. A series interconnect 312 is formed on oxide layer 316 so that anode 308 and cathode 310 are electrically connected to each other. Because of the depth of gap 306, however, oxide layer 316 can not fully fill the gap. Further, the profile of series interconnect 312 is complicated and has a number of sharp corners. Thus, series interconnect 312 is prone to being broken and the reliability of conventional light emitting diode array 400 is reduced.

FIGS. 6-15 depict an embodiment of a process for forming n-side up light emitting diode (LED) array 500. In certain embodiments, the process for forming LED array 500 utilizes a polymer material to partially or fully fill gap 306 between two adjacent LEDs 304A, 304B on first substrate 314. LED array 500 is formed from multiple LED devices that produce significant amounts of light at relatively low current density. Low current density generates less heat and allows polymer materials to be used in forming the LED array.

Figure 6:
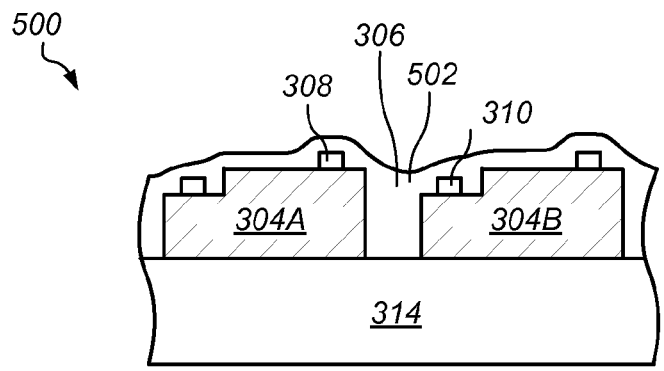
FIG. 6 depicts a cross-sectional view of an embodiment of LEDs formed on a first substrate with polymer material covering and between the LEDs.

First, an LED structure (not shown) is formed on first substrate 314. Next, a separating process (e.g., dicing, cutting, etching, or lasing) is performed to separate the LED structure into a number of LEDs 304 on first substrate 314, as shown in FIG. 6. For simplicity in FIGS. 6 and 7, only two adjacent light emitting diodes including LED 304A and LED 304B are shown and described. First substrate 314 may be, for example, a temporary substrate such as a sapphire substrate. The LED structure may be formed on first substrate 314 using conventional epitaxial techniques known in the art such as metal organic chemical vapor deposition (MOCVD). In certain embodiments, the LED structure includes gallium nitride (GaN) layers formed in multiple deposition processing steps to form GaN LEDs. For example, the LED structure may include a light emitting layer (e.g., a multiple quantum well layer) sandwiched between n-type and p-type doped layers.

As shown in FIG. 6, gap 306 is formed between first LED 304A and second LED 304B after separation of the LED structure. First LED 304A includes a first electrode (e.g., anode 308) and second LED 304B includes a second electrode (e.g., cathode 310). In certain embodiments, a polymer material is deposited on and covers first LED 304A and second LED 304B and is fully filled into gap 306 to form first polymer layer 502. First polymer layer 502 can be made of a photoresist material, for example, polymethylglutarimide (PMGI) or SU-8. In certain embodiments, the refractive index of first polymer layer 502 ranges from 1 to 2.6 (between air and semiconductor) to enhance light extraction. Optical transparency of first polymer layer 502 may be equal to or more than 90% (e.g., equal to or more than 99%). Typically, a thickness of first polymer layer 502 measured on top of anode 308 is approximately 2 microns. In some embodiments, first polymer layer 502 is pre-mixed with phosphor (about 30 weight percentage loading) to adjust the output light color. However, the relative dimension between polymer coating thickness and phosphor particle size should be coordinated. For example, when a thickness of first polymer layer 502 at anode 308 is about 3 microns, proper phosphor particle size is approximately 3 microns or less.

Figure 7:
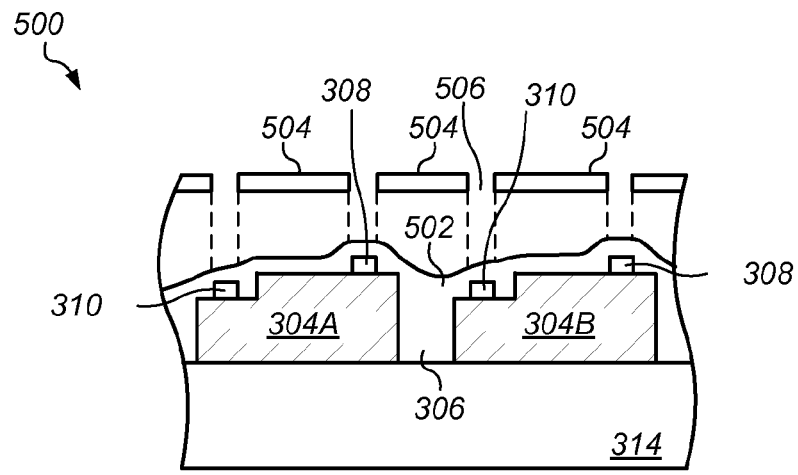
FIG. 7 depicts a cross-sectional view of an embodiment of LEDs formed on a first substrate with polymer material covering and between the LEDs and a patterned mask over the polymer material.

Next, as shown in FIG. 7, patterned mask 504 is applied over the first polymer layer 502. Mask 504 may have openings 506 at the locations of anodes 308 and cathodes 310 to allow the removal of first polymer layer 502 thereon. In some embodiments, the polymer removal process smoothes out the surface profile of first polymer layer 502. In some embodiments, the polymer removal process allows the removal of first polymer layer 502 over first LED 304A and second LED 304B to only leave first polymer layer 502 in gap 306.

In certain embodiments, after the polymer removal process and anodes 308 and cathodes 310 are exposed, a surface hydrophilic modification is performed on the polymer surface (e.g., oxygen plasma) to transform the originally hydrophobic surface into a hydrophilic surface. Therefore, a subsequently formed metal-based interconnect can have improved adhesion to first polymer layer 502.

Figure 8:
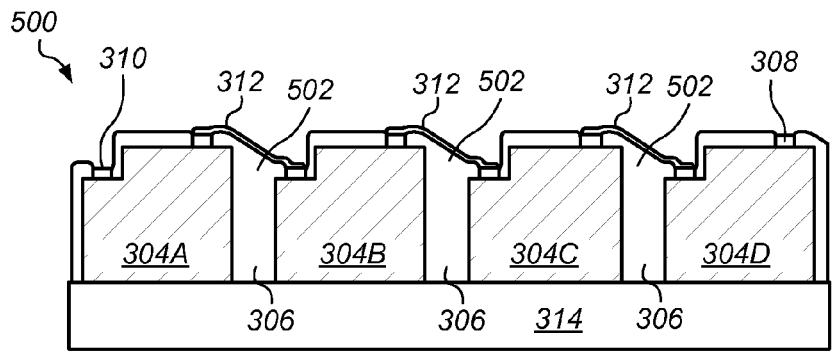
FIG. 8 depicts a cross-sectional view of an embodiment of LEDs formed on a first substrate with a first polymer layer between the LEDs and interconnects between the LEDs.

Subsequently, as shown in FIG. 8, series interconnects 312 are formed on top of first polymer layer 502 to connect anodes 308 and cathodes 310 of adjacent LEDs. In certain embodiments, first polymer layer 502 covers portions of LEDs 304 in addition to filling gaps 306 between the LEDs. In FIG. 8, four LEDs (LEDs 304A-D) are shown with three interconnects 312 between anodes 308 and cathodes 310 of the LEDs. Because of the relatively smooth surface profile of first polymer layer 502, the subsequently formed metal-based interconnects 312 may have thin and smooth profiles. The thin and smooth profiles may provide improved performance and reliability as compared to the conventional interconnect with complex profiles and sharp corners depicted in FIG. 5.

Figure 9:
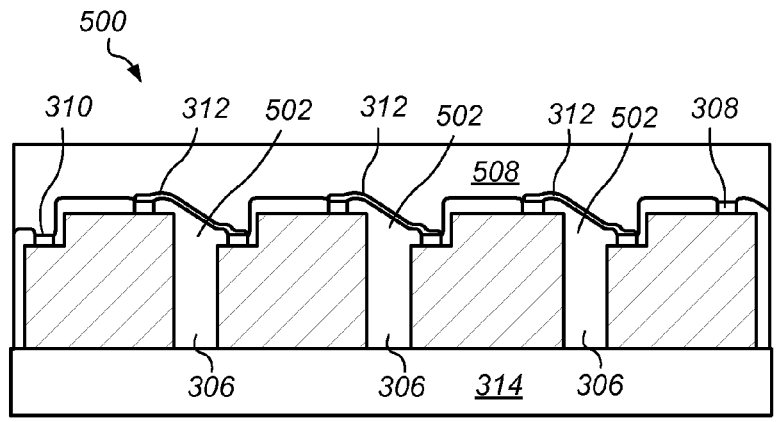
FIG. 9 depicts the embodiment of FIG. 8 with an adhesive layer bonded to the LEDs.

Following formation of interconnects 312 on first polymer layer 502, adhesive layer 508 may be formed over the interconnects and the first polymer layer, as shown in FIG. 9. Adhesive layer 508 may be, for example, epoxy glue, wax, SOG (spin-on-glass), photo resist, monomer, polymer, or any glue type material known in the art for bonding GaN layers to silicon, silicon oxide, metal, ceramic, or polymer layers.

Figure 10:
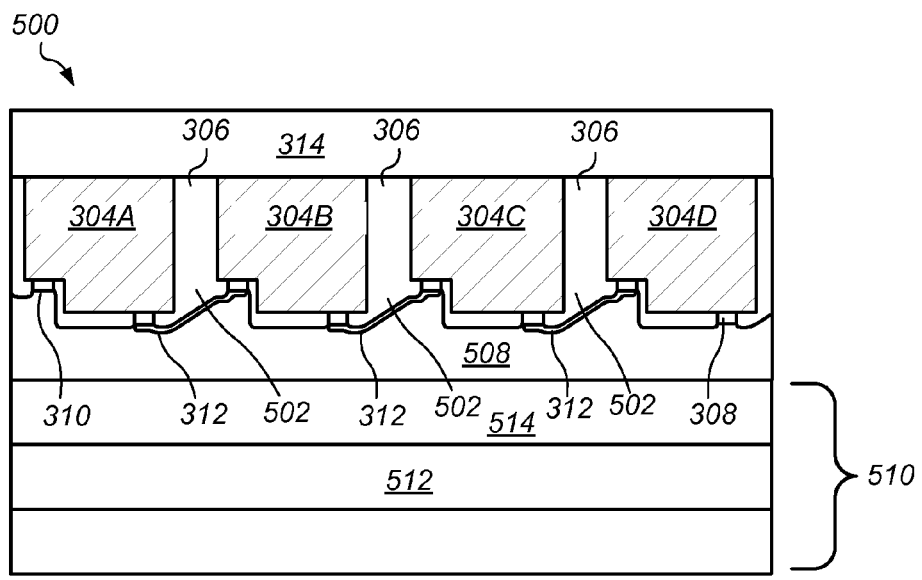
FIG. 10 depicts the embodiment of FIG. 9 with a second substrate bonded to the adhesive layer.

Adhesive layer 508 may be used to bond LED array 500 to second substrate 510, as shown in FIG. 10. Second substrate 510 may be, for example, a silicon substrate or other suitable thermally conductive substrate. Second substrate 510 may be the permanent substrate for LED array 500. In certain embodiments, second substrate 510 includes reflective layer 512 and/or insulating layer 514 formed on a surface of the substrate bonded to adhesive layer 508. Reflective layer 512 may include distributed Bragg reflector (DBR), omni-directional reflector (ODR), silver, aluminum, titanium, and/or other reflective conducting materials. Insulating layer 514 may include oxides, nitrides, and/or other suitable electrically insulating materials with high light transparency. When bonding LED array 500 to a permanent substrate (e.g., second substrate 510), a desired material of adhesive layer 508 is a monomer or uncross-linking polymer. After the bonding process, adhesive layer 508 may be cured to form polymer or cross-linked polymer to increase mechanical strength and chemical stability.

Figure 11:
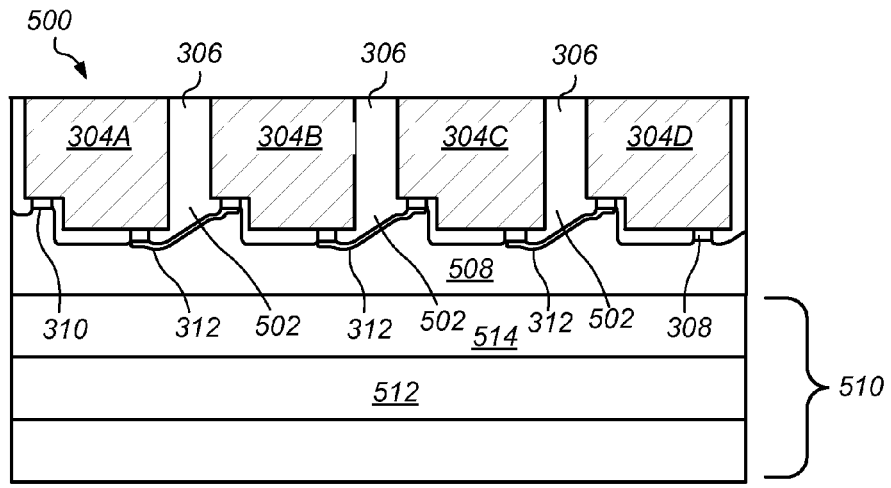
FIG. 11 depicts the embodiment of FIG. 10 with the first substrate removed.

Following bonding to second substrate 510, first substrate 314 is removed from LED array 500, as shown in FIG. 11. First substrate 314 may be removed using, for example, a laser lift-off (LLO) process. Removal of first substrate 314 exposes the surface of LED array 500 opposite interconnects 312 and first polymer layer 502.

Figure 12:
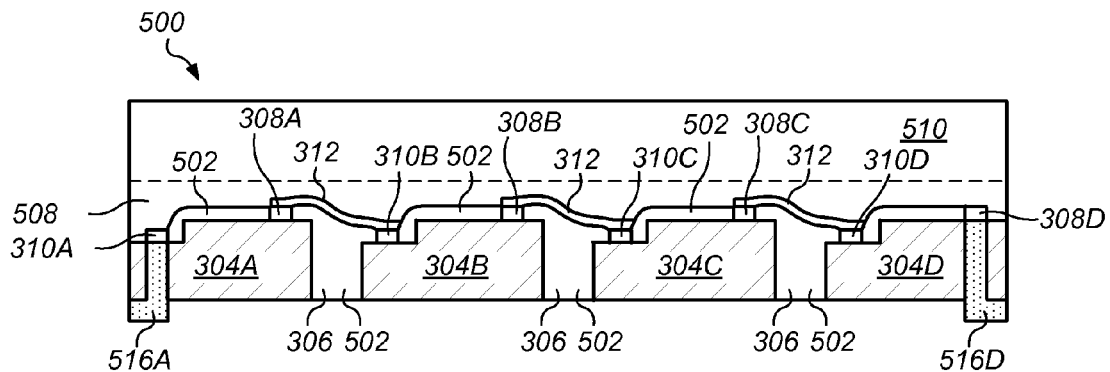
FIG. 12 depicts a schematic, cross-sectional view of an embodiment of an LED array with an external vertical connection made to a cathode of one LED and an external vertical connection made to an anode of another LED.

After exposure of the surface of LED array 500 opposite interconnects 312 and first polymer layer 502, external electrical connections (either vertical or horizontal) may be made to one or more of LEDs 304 (e.g., the outermost LEDs, rightmost LED 304A and leftmost LED 304D, as depicted in FIG. 11). FIG. 12 depicts a schematic, cross-sectional view of an embodiment of LED array 500 with external vertical connection 516A made to cathode 310A of LED 304A and external vertical connection 516D made to anode 308D of LED 304D.

Figure 13:
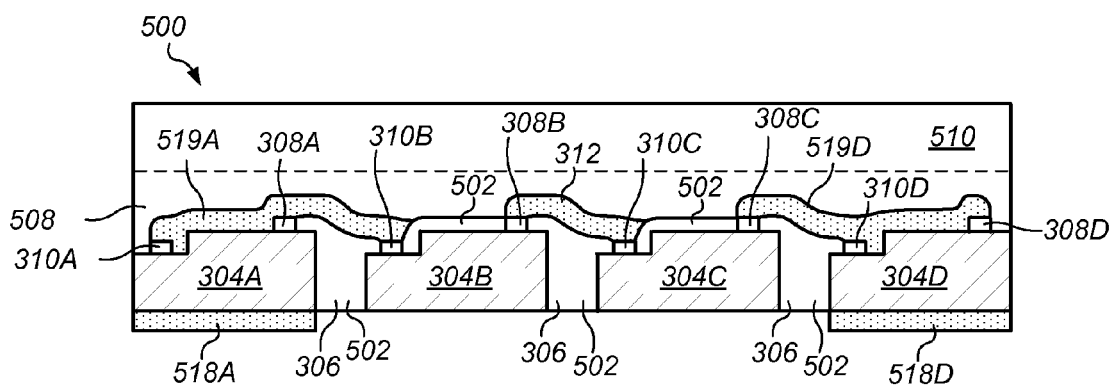
FIG. 13 depicts a schematic, cross-sectional view of an embodiment of an LED array with external horizontal connections made to two LEDs.

FIG. 13 depicts a schematic, cross-sectional view of an embodiment of LED array 500 with external horizontal connection 518A made to LED 304A and external horizontal connection 518D made to LED 304D. It is noted that LED array 500, as depicted in FIG. 13, further includes parallel interconnect 519A on LED 304A and parallel interconnect 519D on LED 304D. Parallel interconnects 519A and 519D short circuit the anodes to the cathodes of the respective LEDs 304A and 304D. Parallel interconnect 519A may be extended to connect to the cathode of adjacent LED 304B. Parallel interconnect 519D may be extended to connect to the anode of adjacent LED 304C. Parallel interconnects 519A and 519D may be formed in a common process or in separate processes from series interconnects 312.

Following formation of either external vertical connections 516 or external horizontal connections 518, the exposed surface of LED array 500 (e.g., the surface of the LED array with the external connections) is encapsulated in a second polymer layer. FIG. 14 depicts a schematic, cross-sectional view of an embodiment of LED array 500 with external vertical connections 516 (e.g., the embodiment depicted in FIG. 12) encapsulated in second polymer layer 520. FIG. 15 depicts a schematic, cross-sectional view of an embodiment of LED array 500 with external horizontal connections 518 (e.g., the embodiment depicted in FIG. 13) encapsulated in second polymer layer 520.

In certain embodiments, the exposed surface of LED array 500 is encapsulated such that substantially the entirety of the exposed surface of the LED array is encapsulated (covered) by second polymer layer 520 (e.g., no portions of the surface of LED array 500 remain exposed). In certain embodiments, second polymer layer 520 encapsulates the exposed surface of LED array 500 while leaving at least part of the external interconnects (e.g., external vertical connections 516 or external horizontal connections 518) exposed such that external connections can be made to the LED array.

In certain embodiments, second polymer layer 520 includes polymer material such as, but not limited to, transparent silicone or a combination of silicone and phosphor. In some embodiments, second polymer layer 520 includes polymer material the same as the polymer material of first polymer layer 502. For example, second polymer layer 520 can be made of a photoresist material, for example, polymethylglutarimide (PMGI) or SU-8. Second polymer layer 520 isolates (encapsulates) LED array 500 from the ambient environment. This encapsulation protects LED array 500 from mechanical damage and environmental influence. In certain embodiments, the encapsulation enhances the light extraction through the curved dome of second polymer layer 520 (e.g., a hemispherical transparent dome), which has a higher refractive index than air.

Figure 16:
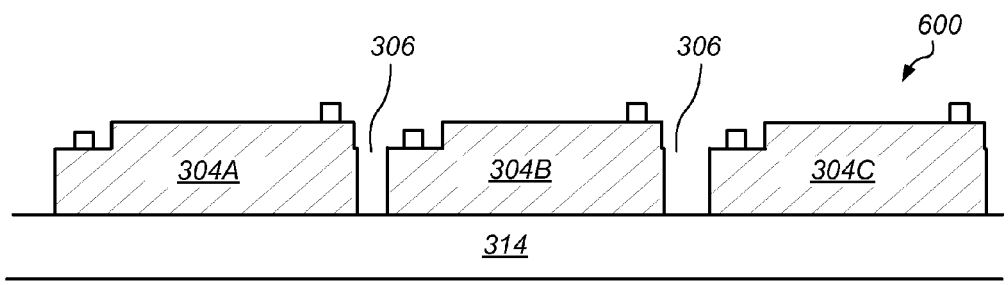
FIG. 16 depicts an embodiment of multiple LEDs separated on a first substrate.

FIGS. 16-22 depict an embodiment of a process for forming multiple p-side up GaN LEDs (p-side up LED array 600) on a single substrate using an epilayer transfer technique with the LEDs isolated before transferring of the substrates and with the LEDs encapsulated in a polymer material. FIG. 16 depicts an embodiment of multiple LEDs 304A, 304B, 304C on first substrate 314. First substrate 314 may be, for example, a sapphire substrate on which LEDs 304A, 304B, 304C are formed.

Separated (isolated) LEDs 304A, 304B, 304C may be formed by depositing epitaxial layers across the substrate and subsequently separating (or isolating) sections of the deposited layers to form the separated (isolated) LEDs. A dicing or cutting saw or a laser may be used to separate the LEDs and form separated LEDs 304A, 304B, 304C on first substrate 314. In some embodiments, an etching process is used to separate the LEDs and form separated LEDs 304A, 304B, 304C on first substrate 314.

The epitaxial layers may be formed on first substrate 314 using conventional epitaxial techniques known in the art such as metal organic chemical vapor deposition (MOCVD). In certain embodiments, the epitaxial layers include gallium nitride (GaN) layers formed in multiple deposition processing steps to form GaN LEDs. For example, the epitaxial layers may include a light emitting layer (e.g., a multiple quantum well layer) sandwiched between n-type and p-type doped layers.

Figure 17:
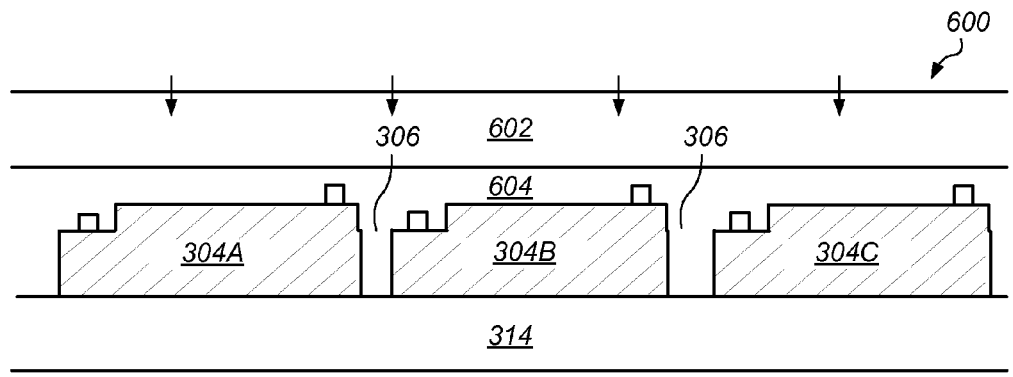
FIG. 17 depicts the embodiment of FIG. 16 bonded to a second substrate with a first adhesive layer.

Following formation of separated LEDs 304A, 304B, 304C on first substrate 314, the upper surface of the LEDs may be bonded to second substrate 602 with first adhesive layer 604, as shown in FIG. 17. In certain embodiments, second substrate 602 is a glass substrate and first adhesive layer 604 is an epoxy glue. As shown in FIG. 17, first adhesive layer 604 may at least partially flow into gaps 306 between LEDs 304A, 304B, 304C.

Figure 18:
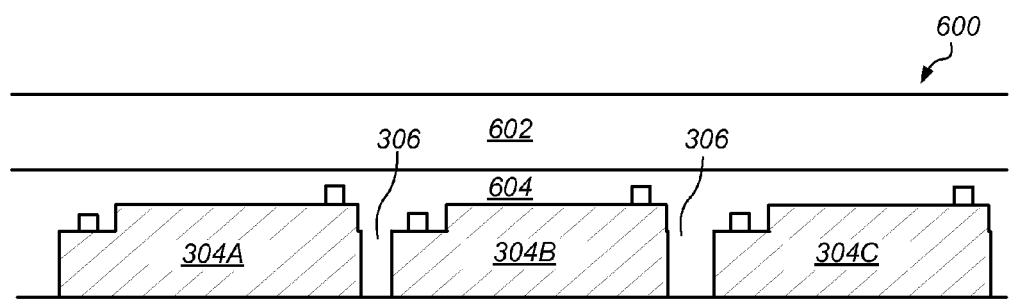
FIG. 18 depicts the embodiment of FIG. 17 with the first substrate removed from the LEDs.

Following bonding to second substrate 602, first substrate 314 is removed from LEDs 304A, 304B, and 304C, as shown in FIG. 18. First substrate 314 may be removed using, for example, a laser lift-off (LLO) process. In some embodiments, the exposed surface of LEDs 304A, 304B, and 304C is roughened by, for example, a wet etching process.

Figure 19:
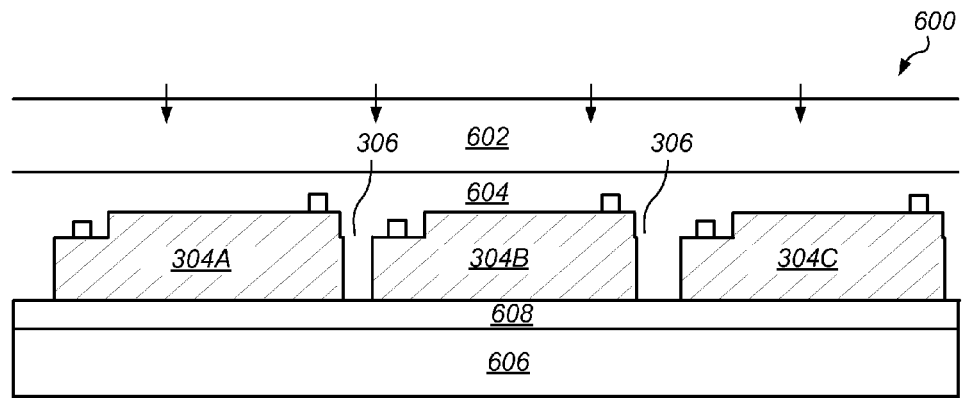
FIG. 19 depicts the embodiment of FIG. 18 with a third substrate bonded to the epitaxial structures with a second adhesive layer.

After removal of first substrate 314, third substrate 606 may be bonded to LEDs 304A, 304B, and 304C with second adhesive layer 608, as shown in FIG. 19. Second adhesive layer 608 may be, for example, epoxy glue, wax, SOG (spin-on-glass), photo resist, monomer, polymer, or any glue type material known in the art for bonding GaN layers to silicon, silicon oxide, metal, ceramic, or polymer layers. In certain embodiments, third substrate 606 includes a reflective layer and/or an insulating layer between the substrate and second adhesive layer 608. Third substrate 606 may be, for example, a silicon substrate or other suitable thermally conductive substrate. When bonding the LED array to a permanent substrate (e.g., third substrate 606), a desired material of second adhesive layer 608 is a monomer or uncross-linking polymer. After the bonding process, second adhesive layer 608 may be cured to form polymer or cross-linked polymer to increase mechanical strength and chemical stability.

Figure 20:
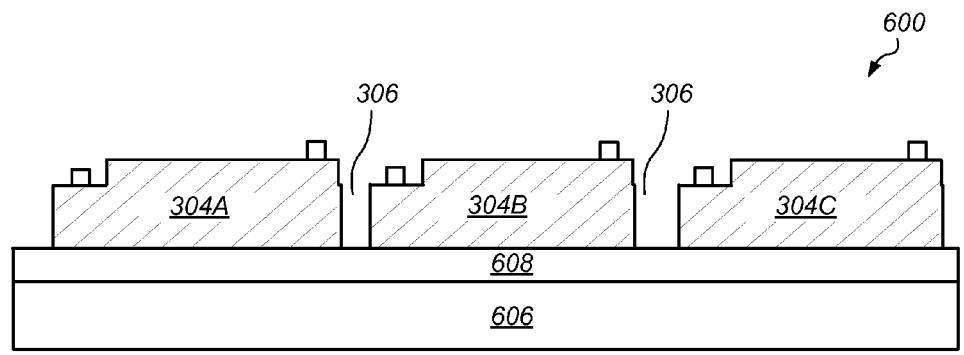
FIG. 20 depicts the embodiment of FIG. 19 with the first adhesive layer and the second substrate removed from the LEDs.
Figure 21:
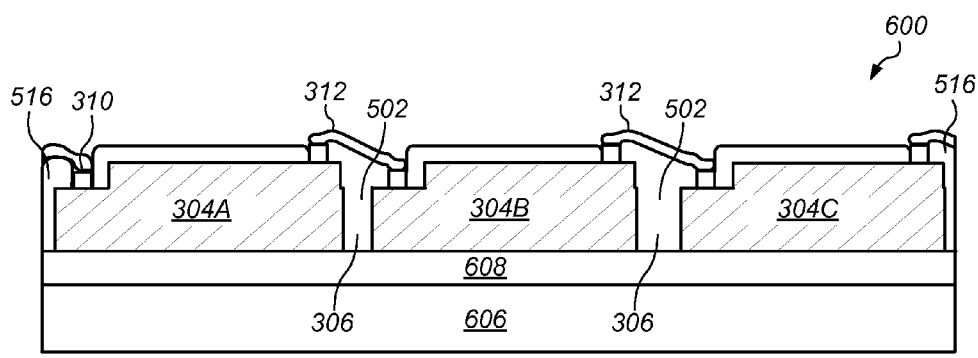
FIG. 21 depicts an embodiment of LEDs formed by separating the third substrate depicted in FIG. 20, filling gaps between the LEDs with polymer material and forming interconnects between the LEDs.

Following bonding of third substrate 606 to LEDs 304A, 304B, and 304C, first adhesive layer 604 and second substrate 602 may be removed from the LEDs, as shown in FIG. 20. Removal of first adhesive layer leaves empty gaps 306 between LEDs 304A, 304B, and 304C. In certain embodiments, a polymer material is deposited into gaps 306 and on LEDs 304A, 304B, and 304C to form first polymer layer 502, as shown in FIG. 21. First polymer layer 502 can be made of a photoresist material, for example, polymethylglutarimide (PMGI) or SU-8. First polymer layer 502 may be formed by depositing the polymer material to fill gaps 306 and cover LEDs 304A, 304B, and 304C followed by patterning of the polymer material (e.g., using a mask and etching process) to form patterned first polymer layer shown in FIG. 21. In certain embodiments, after patterning, first polymer layer 502 covers portions of LEDs 304 in addition to filling gaps 306 between the LEDs. In certain embodiments, after patterning, first polymer layer 502 only fills gaps 306 between LEDs 304.

After formation of first polymer layer 502, series interconnects 312 are formed on top of first polymer layer 502 to connect the anodes and cathodes of adjacent LEDs. Because of the relatively smooth surface profile of first polymer layer 502, the subsequently formed metal-based interconnects 312 may have thin and smooth profiles. The thin and smooth profiles may provide improved performance and reliability as compared to the conventional interconnect with complex profiles and sharp corners depicted in FIG. 5.

Figure 22:
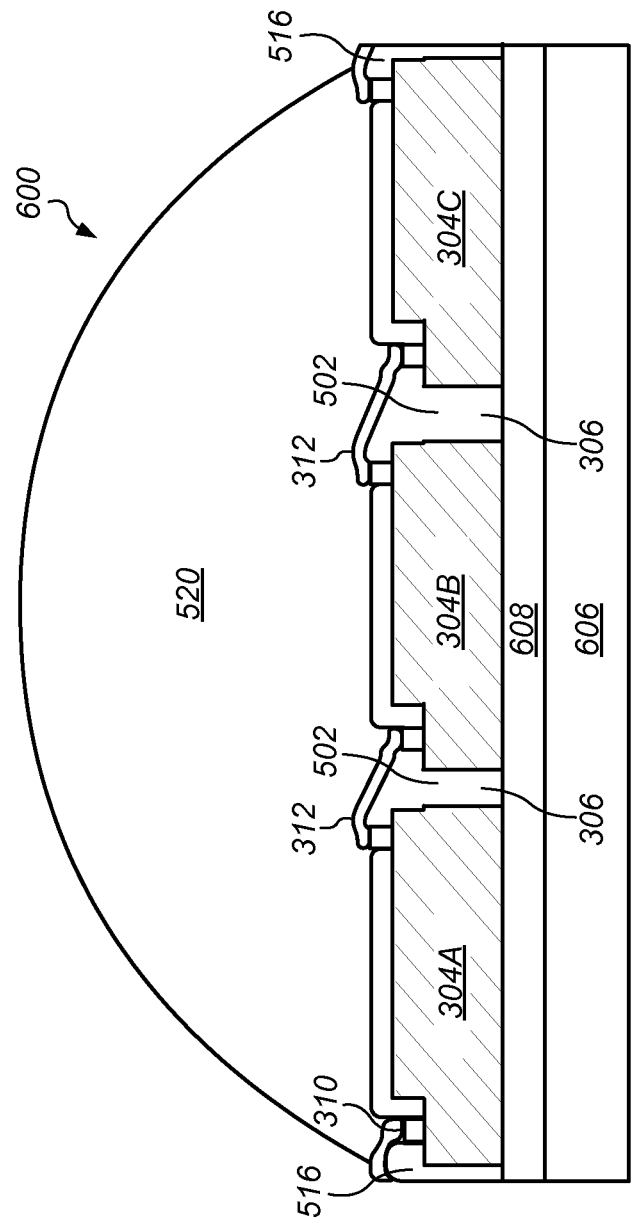
FIG. 22 depicts the embodiment of FIG. 21 encapsulated in a second polymer layer.

Following formation of interconnects 312 on first polymer layer 502, the interconnects and the first polymer layer may be encapsulated in second polymer layer 520, as shown in FIG. 22. In certain embodiments, second polymer layer 520 includes polymer material such as, but not limited to, transparent silicone or a combination of silicone and phosphor. In some embodiments, second polymer layer 520 includes polymer material the same as the polymer material of first polymer layer 502. For example, second polymer layer 520 can be made of a photoresist material, for example, polymethylglutarimide (PMGI) or SU-8.

In some embodiments, portions of one or more LEDs (e.g., outermost LEDs 304A and 304C) are not encapsulated to allow for external connections (e.g., vertical or horizontal external connections) to LED array 600 through the selected LEDs. External connections may be made to the selected LEDs as described herein. In some embodiments, external connections are made before encapsulating LED array 600 in second polymer layer 520.

FIGS. 23-29 depict an embodiment of a process for forming multiple p-side up GaN LEDs on a single substrate using an epilayer transfer technique with the LEDs isolated after transferring of the substrates and with the LEDs encapsulated in a polymer material. FIG. 23 depicts an embodiment of multiple LEDs 304A, 304B, 304C on first substrate 314. First substrate 314 may be, for example, a sapphire substrate on which LEDs 304A, 304B, 304C are formed.

LEDs 304A, 304B, 304C may be formed by depositing epitaxial layers across first substrate 314. The epitaxial layers may be formed on first substrate 314 using conventional epitaxial techniques known in the art such as metal organic chemical vapor deposition (MOCVD). In certain embodiments, the epitaxial layers include gallium nitride (GaN) layers formed in multiple deposition processing steps to form GaN LEDs. For example, the epitaxial layers may include a light emitting layer (e.g., a multiple quantum well layer) sandwiched between n-type and p-type doped layers.

As shown in FIG. 23, LEDs 304A, 304B, 304C have not yet been separated or isolated. The dashed lines in FIG. 23 (and in FIGS. 24-27) represent the lines along which LEDs 304A, 304B, 304C will later be separated.

Following formation of LEDs 304A, 304B, 304C on first substrate 314, the upper surface of the LEDs may be bonded to second substrate 602 with first adhesive layer 604, as shown in FIG. 24. In certain embodiments, second substrate 602 is a glass substrate and first adhesive layer 604 is epoxy glue. As epitaxial structures LEDs 304A, 304B, 304C have not been separated, there are no gaps for first adhesive layer 604 to flow between the LEDs.

Following bonding to second substrate 602, first substrate 314 is removed from LEDs 304A, 304B, 304C, as shown in FIG. 25. First substrate 314 may be removed using, for example, a LLO process. In some embodiments, the exposed surfaces of LEDs 304A, 304B, 304C are roughened by, for example, a wet etching process.

After removal of the first substrate, third substrate 606 may be bonded to LEDs 304A, 304B, 304C with second adhesive layer 608, as shown in FIG. 26. Second adhesive layer 608 may be, for example, epoxy glue, wax, SOG (spin-on-glass), photo resist, monomer, polymer, or any glue type material known in the art for bonding GaN layers to silicon, silicon oxide, metal, ceramic, or polymer layers. In certain embodiments, third substrate 606 includes a reflective layer and/or an insulating layer between the substrate and second adhesive layer 608. Third substrate 606 may be, for example, a silicon substrate or other suitable thermally conductive substrate. Third substrate 606 may be the permanent substrate for LEDs 304A, 304B, 304C. When bonding the LED array to a permanent substrate (e.g., third substrate 606), a desired material of second adhesive layer 608 is a monomer or uncross-linking polymer. After the bonding process, second adhesive layer 608 may be cured to form polymer or cross-linked polymer to increase mechanical strength and chemical stability.

After bonding of third substrate 606 to LEDs 304A, 304B, 304C, first adhesive layer 604 and second substrate 602 are removed from the LEDs, as shown in FIG. 27. First adhesive layer 604 and second substrate 602 may be removed using, for example, an LLO process or an acid etching process.

After removal of first adhesive layer 604 and second substrate 602 from LEDs 304A, 304B, 304C, the epitaxial layers and third substrate 606 are separated along the dashed lines (shown in FIG. 27) to form separated LEDs 304A, 304B, 304C, as shown in FIG. 28. 304A, 304B, 304C and third substrate 606 may be separated using, for example, a dicing (cutting) saw or a laser. In some embodiments, an etching process is used to separate 304A, 304B, 304C and third substrate 606.

After separating LEDs 304A, 304B, 304C, polymer material is deposited into gaps 306 and on LEDs 304A, 304B, and 304C to form first polymer layer 502, as shown in FIG. 28. First polymer layer 502 can be made of a photoresist material, for example, polymethylglutarimide (PMGI) or SU-8. First polymer layer 502 may be formed by depositing the polymer material to fill gaps 306 and cover LEDs 304A, 304B, and 304C followed by patterning of the polymer material (e.g., using a mask and etching process) to form patterned first polymer layer shown in FIG. 28. In certain embodiments, after patterning, first polymer layer 502 covers portions of LEDs 304 in addition to filling gaps 306 between the LEDs. In certain embodiments, after patterning, first polymer layer 502 only fills gaps 306 between LEDs 304.

Figure 29:
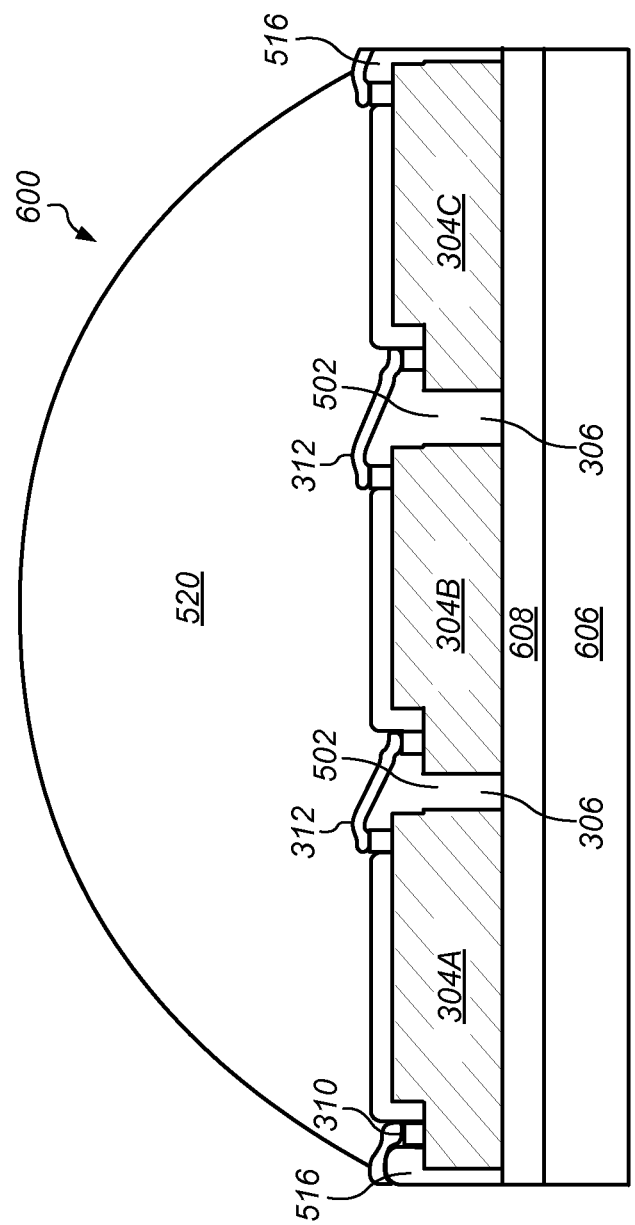
FIG. 29 depicts the embodiment of FIG. 28 encapsulated in a second polymer layer.

After formation of first polymer layer 502, series interconnects 312 are formed on top of first polymer layer 502 to connect the anodes and cathodes of adjacent LEDs. Following formation of interconnects 312 on first polymer layer 502, the interconnects and the first polymer layer may be encapsulated in second polymer layer 520, as shown in FIG. 29. In certain embodiments, second polymer layer 520 includes polymer material such as, but not limited to, transparent silicone or a combination of silicone and phosphor. In some embodiments, second polymer layer 520 includes polymer material the same as the polymer material of first polymer layer 502. For example, second polymer layer 520 can be made of a photoresist material, for example, polymethylglutarimide (PMGI) or SU-8.

In some embodiments, portions of one or more LEDs (e.g., outermost LEDs 304A and 304C) are not encapsulated to allow for external connections (e.g., vertical or horizontal external connections) to LED array 600 through the selected LEDs. External connections may be made to the selected LEDs as described herein. In some embodiments, external connections are made before encapsulating LED array 600 in second polymer layer 520. Second polymer layer 520 isolates (encapsulates) LED array 600 from the ambient environment. This encapsulation protects LED array 600 from mechanical damage and environmental influence. In certain embodiments, the encapsulation enhances the light extraction through the curved dome of second polymer layer 520 (e.g., a hemispherical transparent dome), which has a higher refractive index than air.

It is to be understood the invention is not limited to particular systems described which may, of course, vary. It is also to be understood that the terminology used herein is for the purpose of describing particular embodiments only, and is not intended to be limiting. As used in this specification, the singular forms "a", "an" and "the" include plural referents unless the content clearly indicates otherwise. Thus, for example, reference to "a device" includes a combination of two or more devices and reference to "a material" includes mixtures of materials.

Further modifications and alternative embodiments of various aspects of the invention will be apparent to those skilled in the art in view of this description. Accordingly, this description is to be construed as illustrative only and is for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

What is claimed is:

1. A method for forming a light emitting diode array, comprising:

forming a first light emitting diode and a second light emitting diode on a first temporary substrate;

coupling a second temporary substrate to an upper surface of the light emitting diodes;

removing the first temporary substrate from the light emitting diodes;

coupling a permanent substrate to a side of the light emitting diodes from which the first temporary substrate has been removed;

removing the second temporary substrate from the light emitting diodes;

forming a first polymer layer between the first light emitting diode and the second light emitting diode;

forming an interconnect between a first electrode on the first light emitting diode and a second electrode on the second light emitting diode, wherein the interconnect is formed at least partially on the first polymer layer; and at least partially encapsulating the side of the light emitting diodes comprising the interconnect in a second polymer layer.

2. The method of claim 1, further comprising bonding the permanent substrate to the light emitting diodes with an adhesive layer.

3. The method of claim 1, wherein the first light emitting diode and the second light emitting diode are separated by a gap, and the method further comprising forming the first polymer layer by covering the light emitting diodes and filling the gap between the diodes with a polymer material, patterning the polymer material, and removing portions of the polymer material according to the pattern to form the first polymer layer.

4. The method of claim 1, further comprising forming an external interconnect to a third electrode on at least one of the light emitting diodes, wherein at least a portion of the external interconnect is not encapsulated by the second polymer layer.

5. The method of claim 1, wherein the first temporary substrate is temporarily bonded to the light emitting diodes with an adhesive layer, and wherein the adhesive layer is removed when the first temporary substrate is removed.

6. The method of claim 1, further comprising encapsulating the interconnect in the second polymer layer.

7. The method of claim 1, wherein the permanent substrate comprises a reflective layer.

8. The method of claim 1, wherein the permanent substrate comprises an insulating layer.

9. The method of claim 1, wherein the first polymer layer comprises photoresist.

10. The method of claim 1, wherein the second polymer layer comprises silicone.

11. A method for forming a light emitting diode array, comprising:

forming a first light emitting diode and a second light emitting diode on a first temporary substrate;

coupling a second temporary substrate to an upper surface of the light emitting diodes;

removing the first temporary substrate from the light emitting diodes;

coupling a permanent substrate to a side of the light emitting diodes from which the first temporary substrate has been removed;

removing the second temporary substrate from the light emitting diodes;

separating the first light emitting diode and the second light emitting diode on the permanent substrate;

forming a first polymer layer between the first light emitting diode and the second light emitting diode;

forming an interconnect between a first electrode on the first light emitting diode and a second electrode on the second light emitting diode, wherein the interconnect is formed at least partially on the first polymer layer; and at least partially encapsulating the side of the light emitting diodes comprising the interconnect in a second polymer layer.

12. The method of claim 11, further comprising bonding the permanent substrate to the light emitting diodes with an adhesive layer.

13. The method of claim 11, wherein the first light emitting diode and the second light emitting diode are separated by a gap, and the method further comprising forming the first polymer layer by covering the light emitting diodes and filling the gap between the diodes with a polymer material, patterning the polymer material, and removing portions of the polymer material according to the pattern to form the first polymer layer.

14. The method of claim 11, further comprising forming an external interconnect to a third electrode on at least one of the light emitting diodes, wherein at least a portion of the external interconnect is not encapsulated by the second polymer layer.

15. The method of claim 11, wherein the first temporary substrate is temporarily bonded to the light emitting diodes with an adhesive layer, and wherein the adhesive layer is removed when the first temporary substrate is removed.

16. The method of claim 11, further comprising encapsulating the interconnect in the second polymer layer.

17. The method of claim 11, wherein the permanent substrate comprises a reflective layer.

18. The method of claim 11, wherein the permanent substrate comprises an insulating layer.

19. The method of claim 11, wherein the first polymer layer comprises photoresist.

20. The method of claim 11, wherein the second polymer layer comprises silicone.

* * * * *